Jan. 16, 1968 C. J. BLACK, JR., ETAL 3,364,458

UNIVERSAL EXTENSION CONNECTOR FOR USE WITH INDEXED PRINTED CIRCUIT BOARDS AND CONNECTOR PLUGS

Filed June 1, 1966 2 Sheets-Sheet 1

INVENTORS.
CHARLES J. BLACK, Jr
JOSEPH J. KOWELL
BY Henry Huff
ATTORNEY.

Jan. 16, 1968 C. J. BLACK, JR., ETAL 3,364,458

UNIVERSAL EXTENSION CONNECTOR FOR USE WITH INDEXED PRINTED CIRCUIT BOARDS AND CONNECTOR PLUGS

Filed June 1, 1966 2 Sheets-Sheet 2

INVENTORS.
CHARLES J. BLACK, Jr.
JOSEPH J. KOWELL

BY Henry Huff
ATTORNEY

United States Patent Office 3,364,458
Patented Jan. 16, 1968

3,364,458

UNIVERSAL EXTENSION CONNECTOR FOR USE WITH INDEXED PRINTED CIRCUIT BOARDS AND CONNECTOR PLUGS

Charles J. Black, Jr., Huntington Station, and Joseph J. Kowell, South Farmingdale, N.Y., assignors to Kernforschungsanlage Julich des Landes Nordrhein-Westfalen-e.V., Julich, Germany, a corporation of Germany Filed June 1, 1966, Ser. No. 554,399
17 Claims. (Cl. 339—184)

This invention relates to an extension connector for providing a plurality of connections to an indexed printed circuit board and more particularly it relates to an extension connector which assures that the only connector plug that may be connected through the extension connector to the indexed circuit board is one which is indexed to mate with the circuit board index.

In the construction of electronic equipment it is common practice to employ printed circuit techniques in which the circuitry is formed on a thin, flat, rigid sheet or board of insulating material and the circuit elements such as resistors, capacitors, transistors, etc., are mounted directly on the circuit board. Electrical connections are made to the circuitry of the circuit board by means of a plurality of conductive contacts that are disposed along an edge of the circuit board and which are adapted to make a mating connection with contacts on a suitable connector plug. Large and complex electronic systems employ many circuit boards and in order to package the equipment in as small a volume as possible the connector plugs into which the boards are inserted are mounted on a chassis in closely adjacent relationship so that the many circuit board are disposed edgewise in closely spaced, parallel relationship with very little space between adjacent boards. The circuitry on the individual circuit boards very often includes test points or junctions to which test equipment must be connected during testing and troubleshooting of the system. Because the circuit boards are spaced so closely together it often is difficult or impossible to insert a test probe between circuit boards to gain access to a test point on a board. To overcome this difficulty it has become common practice to provide extension connectors which are comprised of a plurality of electrical conductors that are supported within a housing and which have on their respective ends electrical connectors which mate respectively with the circuit board and the connector plug. These extension connectors are of sufficient length so that when one end of their conductors are connected into the connector plug that is mounted on the chassis their other ends extend beyond the outer ends of the mounted circuit boards. These other ends of the extension connector now are readily available and the circuit board to be tested now may be inserted into the outer ends of the extension connector conductors. The circuit board to be tested now is electrically connected in the system and physically is disposed beyond the other compactly spaced circuit boards so that both of its surfaces, which may include test points, are readily accessible and there is no difficulty in bringing the test probe into contact with test points on the circuit board.

To assure that the correct circuit board is inserted into its corresponding connector plug mounted on a chasis various schemes have been employed to index the respective connector plugs and circuit boards so that only the correct circuit board can be inserted into a particular connector plug. This avoids system malfunctions and/or damage to circuit components that might result if an incorrect circuit board were inserted within a connector plug. Because of this indexing of the connector plugs and circuit boards, extension connectors also must be indexed in order that connections may be made between corresponding circuit boards and connectors. In the past, the extension connectors have been individually indexed to be compatible with respective connector plugs and circuit boards. Although this served the desired purpose, it required that individual extension connectors be provided for each pair of circuit board and connector plug. In complex electrical systems wherein many circuit boards were employed, this practice of providing a plurality of extension connectors, each individually indexed, became quite costly and created a supply and storage problem.

It therefore is a principal object of this invention to provide an extension connector which may provide electrical connections between a circuit board and a spaced connector plug irrespective of the particular indexing of the circuit board and connector plug.

It is another object of this invention to provide a universal extension connector which may provide electrical connections between spaced circuit boards and connector plugs even though different pairs of circuit boards and connector plugs are indexed differently, whereby only one extension connector is required to test a great many circuit boards in a complex electronic system.

These and other objects and advantages of the present invention are accomplished in one illustrated embodiment of the present invention by a universal extension connector that is comprised of a rigid housing means that supports in electrical isolation from each other a plurality of longitudinally-extending conductors of equal lengths that are non-compressible in their longitudinal dimensions, and which individually are longitudinally translatable through the housing means. One end of each longitudinally-extending conductor is provided with a contact for making an electrical connection with one of a plurality of electrical contacts that are disposed in spaced parallel relationship along an outwardly extending edge of an electrical circuit board. The conductors of the extension connector are longitudinally aligned with respective contacts on the circuit board and with respective recessed contacts on a connector plug that is longitudinally spaced from the circuit board. The other ends of the extension connector conductors are adapted to make a mating contact with recessed contacts of the connector plug. The circuit board is indexed by providing one or more notches or void spaces in its outwardly extending edge so that one or more contacts are eliminated therefrom. The connector plug is similarly indexed by blocking one or more of its recessed contacts to prevent a conductor of the extension connector from being inserted therein. The conductors of the extension connector are inserted into registering unblocked recessed contacts in the connector plug so that the opposite ends of these conductors are in transverse alignment at the opposite end of the housing means. The one or more blocked contacts of the connector plug will prevent registering extension connector conductors from being inserted therein and the opposite ends of these conductors will extend longitudinally beyond the aligned ends of the remainder of the conductors.

The contacts on the extending edge of the circuit board are brought into contact with the transversely aligned opposite ends of the extension connector conductors, and the one or more conductors that extend beyond the aligned ends are disposed within the indexing slots or void spaces in the outwardly extending edge of the circuit board. Therefore, electrical connections are established between desired contacts of the similarly indexed circuit board and connector plug. If the connector plug had been indexed differently from the circuit board it would have caused one or more extension connector conductors to be outwardly extending at positions where there were no registering slots or void spaces in the edge of the circuit board, thereby preventing the remainder of the circuit board contacts from making contact with the ends of the transversely aligned ends of the conductors.

Because the conductors of the extension connector individually are longitudinally translatable they will function in the manner described above for any indexing pattern of the circuit board and connector plug.

The present invention will be described by referring to the accompanying drawings wherein.

Figure 4:
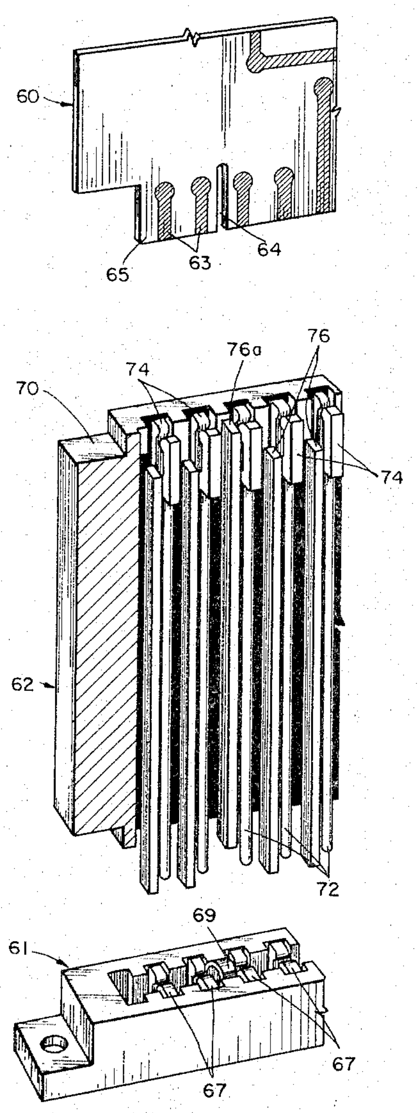
Figure 5:
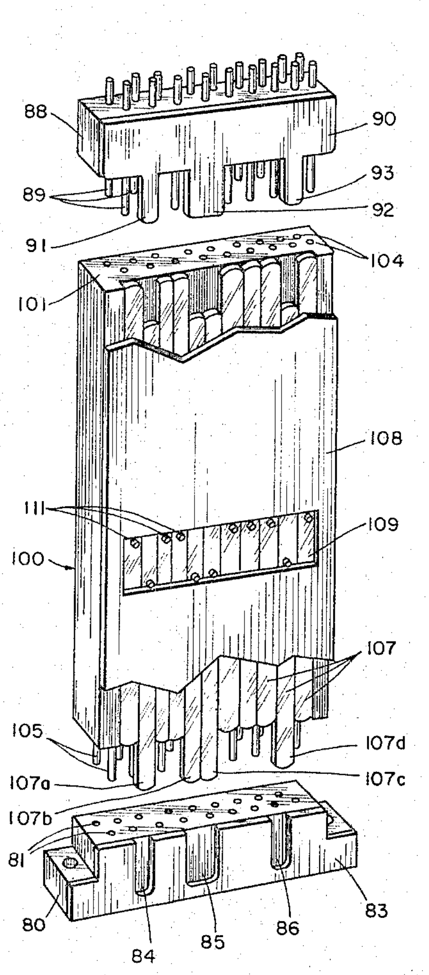

FIG. 4 is an illustration of an alternative embodiment of the present invention in which the proper electrical connections are established by an extension connector having translatable indexing members that are disposed between fixed conductors of the extension connector; and FIG. 5 is another embodiment of the invention in which the extension connector is comprised of fixed conductors and translatable indexing members that are disposed on an external surface of the connector.

Figure 1:
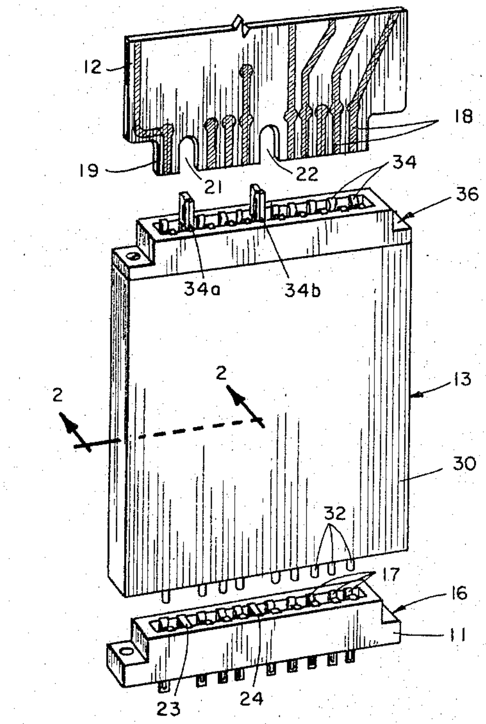
FIG. 1 is a perspective view of a universal extension connector disposed in spaced relationship from an indexed circuit board and a similarly indexed connector plug.
Figure 2:
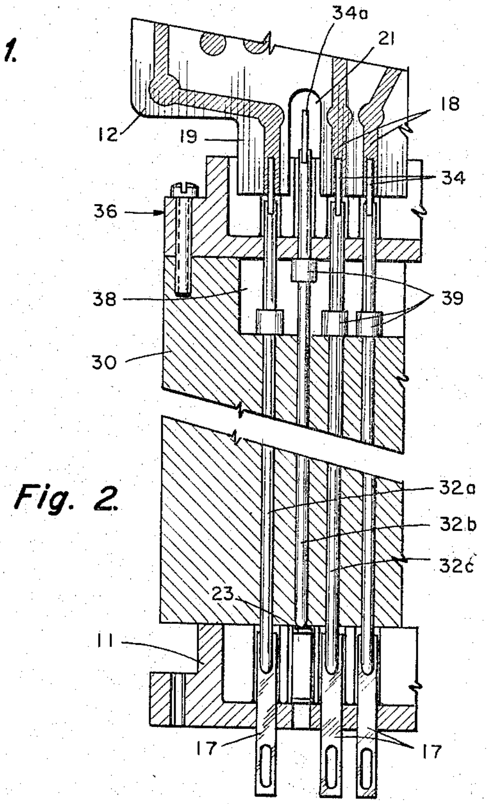
FIG. 2 is a sectional view of a portion of the arrangement illustrated in FIG. 1, generally taken along the section 2—2 of FIG. 1, but with the various members shown in engagement.

Referring now in detail to the drawings, a first embodiment of the invention is illustrated in FIGS. 1 and 2. FIG. 1 shows in spaced apart relationship a connector plug 11, a printed circuit board 12 and the extension connector 13 of this invention. Connector plug 11 is a conventional type which is comprised of a dielectric housing 16 having a plurality of recesses throughout its central region into which are disposed the electrical contacts 17 which are U-shaped members of conductive material that form a recessed spring-type contact. An electrical terminal that is in conductive connection with contacts 17 extends through the bottom surface of terminal plug 11 and electrical connections from an electronic system may be secured to these terminals. It often occurs in practice that not all contacts 17 are required for a particular circuit. In this instance, certain ones of the connectors are removed and a suitable blocking means, such as a thin strip of metal is disposed across each slot from which a contact has been removed to prevent any mating contact from entering into the blocked slots. In this manner the connector plug 11 is indexed by the blocking means 23 and 24 so that only a mating connector that is similarly indexed may be inserted within the recessed contacts to establish the desired electrical connections.

The electrical contacts 18 on circuit board 12 are disposed in spaced parallel relationship along the outwardly extending edge 19 of the board and are spaced from each other by distances corresponding to the spacing between the recessed contacts 17 in connector plug 11. Normally, circuit board 12 is inserted within the connector plug 11 with the contacts 18 in electrical and physical engagement with the corresponding contacts 17 in the connector plug 11. It will be noted that in the outwardly extending portion 19 of circuit board 12 two recesses or slots 21 and 22 are provided. These slots 22 eliminate from the outwardly extending edge 19 respective connectors that would have been longitudinally aligned with the blocking means 23 and 24 that are disposed over corresponding recesses in connector plug 11. This arrangement of the slots 21 and 22 in the outwardly extending edge 19 thus providing indexing means that correspond to the indexing provided by the blocking means 23 and 24 in connector plug 11. Only circuit boards having slots 21 and 22 in the same positions as illustrated on circuit board 12 can be inserted within the connector plug 11 of FIG. 1.

The extension connector 13 of this invention is comprised of a housing member 30 which desirably is made of a high-impact plastic material which has disposed therein a plurality of longitudinally extending conductors, such as conductors 32*a*, 32*b* and 32*c* of FIG. 2, each of which is individually longitudinally translatable within the housing member 30. The conductors 32 of the extension connector all are of the same length and are non-compressible in their longitudinal dimensions. The top end of each conductor is provided with a U-shaped connector 34 which is adapted to make an engaging contact with the connector strips 18 on circuit board 12. The opposite ends of the conductors 32 in extension connector 13 are pin-type connectors that are adapted to be inserted within the recessed connectors 17 in connector plug 11. It will be seen in FIG. 1 that the U-shaped contacts 34 on the upper ends of the connectors 32 of extension connector 13 provide connectors that are substantially identical to those in connector plug 11. The top portion 36 of extension connector 13 in fact may be the body of a connector plug of the same type as connector plug 11, but whose contacts have been removed. As illustrated in FIG. 2, holes have been drilled through the top portion 36 to permit the conductors 32 to extend therethrough. A hollow portion 38 is provided within housing member 30 and collars 39 are placed on each of the conductors 32 to limit their translation between the bottom surface of the hollow portion 38 and the bottom surface of the top member 36.

In the typical use of the extension connector 13 to raise the circuit board 12 above the connector plug 11, the circuit board 12 first will be inserted within the top portion 36 of extension connector 13 so that the contacts 18 engage the respective contacts 34 on the upper ends of conductors 32. When circuit board 12 is inserted within extension connector 13 the slots 21 and 22 in the circuit board will be in registration with the contacts 34*a* and 34*b*, FIG. 1, of the corresponding conductors of the extension connector, thereby permitting the full insertion of circuit board 12 into extension connector 13. The bottom ends of the conductors 32 are extended downwardly from the bottom surface of extension connector 13 and may be inserted into the longitudinally aligned connectors 17 in connector plug 11. However, because of the blocking means 23 and 24 which are substituted in the place of the second and sixth connectors in the terminal plug 11, the corresponding conductors of extension connector 13 cannot enter the terminal plug 11 and will be urged upwardly so that the connectors 34*a* and 34*b* are received within the slots 21 and 22 in circuit board 12, as best seen in FIG. 2.

Assume now that extension connector 13 is connected in plug connector 11 and assume that an attempt is made to insert an incorrect circuit board into extension connector 13, for example, a circuit board that did not have a slot 21 in its outwardly extending edge 19. The connector 34*a* still would be extending above the upper surface of the extension connector and would engage the circuit board before any of the contacts 18 on the circuit board were able to engage their corresponding contacts 34 in the extension connector. This would prevent the insertion of the incorrectly indexed circuit board into the extension connector 13. It therefore may be seen that the individually translatable conductors 32 in the extension connector 13 effectively translate the indexing of the connector plug 11 to the top contacts 34 of the extension connector and this will be accomplished by any arrangement of blocking means in the connector plug 11.

With the correctly indexed circuit board properly inserted within the extension connector 13, which in turn is properly connected in a connector plug 11, the circuit board 12 is raised above other closely adjacent circuit boards which are directly inserted into their corresponding connector plugs. Thus, the raised circuit board is readily accessible while at the same time being connected into the system under test.

Figure 3:
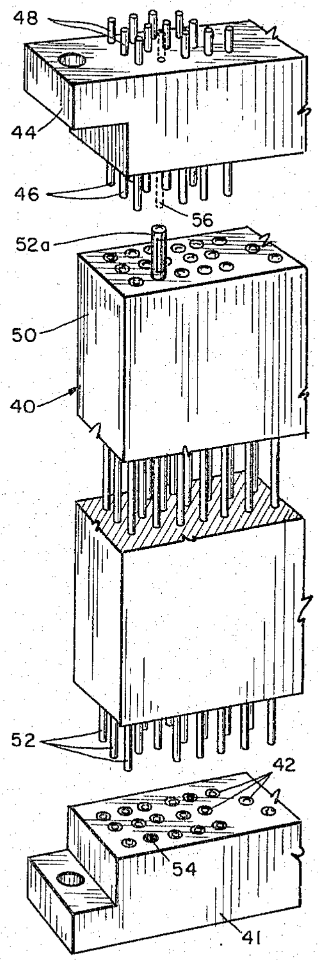
FIG. 3 is an illustration of an alternative embodiment of the present invention in which the extension connector is adapted to provide correct connections between connector plugs having, respectively, outwardly extending contact points and recessed contacts, the indexing being provided by the removal of pins and the blocking of corresponding recessed contacts.

FIG. 3 is an illustration of a portion of an alternative embodiment of a universal extension connector 40 which is adapted to make the correct electrical connections between spaced contacts of a different nature than those illustrated in FIGS. 1 and 2. In this embodiment of the invention the connector plug 41 has a plurality of recessed contacts 42 which are in the nature of hollow cylindrically-shaped cups which extend into the plug. A plurality of electrical terminals are disposed on the bottom surface of connector plug 31 and extend inwardly to make connection with a respective recessed contact 42. The connector plug 44 that is disposed at the top of extension connector 40 has a plurality of pin-type connectors 46 extending downwardly from its bottom surface and these pins 46 are arranged in a pattern that corresponds to the pattern of the recessed contacts 42 on the bottom connector plug 41. The pins 46 are insertable within the recessed contacts 42 to establish desired electrical connections between the terminals 48 on the top surface of connector plug 44 and corresponding terminals on the bottom surface of connector plug 41.

Extension connector 40 is comprised of a housing member 50 of a dielectric material and includes a plurality of longitudinally extending conductors 52 which are longitudinally non-compressible, are individually longitudinally translatable, and are physically arranged in a pattern that corresponds to that of the pins on connector plug 44 and the recessed contacts in connector plug 41. The top ends of the conductors 52 have recessed contacts that are adapted to receive aligned pins 46 in the upper connector plug 44, and the bottom ends of the conductors 52 are provided with pin-type contacts that are adapted to fit within the recessed contacts 42 of the bottom connector plug 41. The recessed contacts 42 in the bottom connector plug 41 are indexed by inserting a dielectric plug 54 within a recessed connector that will not be used for establishing electrical connections. The dielectric plug 54 is substantially flush with the top surface of connector plug 11 and thereby serves as a blocking means to prevent the bottom contact of a conductor 52 of the extension connector from being inserted therein. The pin-type contacts 46 on the upper connector plug 44 are indexed to correspond to the indexing of connector plug 41 by removing a pin from the regular pattern of pins so that a void space, such as the space 56, exists within the pattern.

In their assembled positions, the recessed contacts on the upper ends of conductors 52 of extension connector 40 are brought into contacting engagement with the respective aligned pins 46 of the upper connector plug 44 so that all of the conductors 52, except those such as conductor 52*a* which are in alignment with a void space such as 56, have their bottom ends pushed downwardly beyond the bottom surface of housing member 50. The bottom ends of conductors 52 then are inserted within respective recessed contacts 42 in the bottom connector plug 41. However, the blocking means such as 54 will prevent the conductor 52*a* aligned therewith from entering into its respective recessed connector 42 and will cause the upper end of the conductor 52*a* to extend into the void space 56 in the pattern of pin-type connectors 46 in top connector plug 44. In this relationship, the desired electrical connections are established between connector plugs 41 and 44 so that desired electrical tests may be performed on an operating system and the operator is assured that the correct electrical connections have been established because only similarly indexed connector plugs 41 and 44 could have been connected through the extension connector 40.

In the event that it is attempted to establish connections between connector plugs that are not identically indexed, that is, assume that a pin is actually present in place of the void space 56, conductor 52*a* will now be pushed downwardly and will extend out the bottom of housing member 50. Pin 52*a* cannot enter the longitudinally aligned recessed contact 42 because of blocking means 54 so that the bottom ends of the remainder of the conductors 52 cannot enter into their respective aligned recessed contacts 42 and electrical connections will not be established between the connector plugs.

In the embodiments just described, indexing was accomplished by the removal of a contact either on the circuit board as in FIG. 1, or by the removal of a pin contact as in FIG. 3. There may be instances where it is undesirable to sacrifice a contact on a board or plug, in which case it will be necessary to establish indexing by other means. One possible arrangement is illustrated in FIG. 4 which shows a portion of a circuit board 60 and a connector plug 61, and a portion of the extension connector 62. Extension connector 62 is rectangular in shape and is several times as wide as the portion that is illustrated in FIG. 4. In the circuit board 60, none of the contacts 63 are removed to provide an indexing slot or void space, but rather, the slot 64 in the outwardly extending edge 65 is positioned between adjacent contacts. The connector plug 61 is of a conventional type having the recessed U-shaped contacts 67 which are in longitudinal alignment with contacts on the connector plug 61. Indexing is accomplished in connector plug 61 by placing a blocking means 69 in the space between adjacent ones of the contacts 67 to prevent anything from entering therein. Blocking means 69 and the slot 64 in circuit board 60 are in longitudinal alignment.

Extension connector 62 is comprised of a housing that preferably is made of a high impact plastic material, and includes a plurality of conductors 72 that extend throughout the length of the housing member. In this embodiment of the invention the conductors 72 are fixed to the housing member 70 rather than being translatable as in the previously described embodiments. The top ends of conductors 72 have U-shaped contacts 74 affixed thereto which are adapted to make mating electrical connections with the contacts 63 on circuit board 60. The lower ends of conductors 72 extend beyond the bottom bounding surface of housing member 70 and are adapted to be inserted into the U-shaped contacts 67 in connector plug 61. Disposed between the conductors 72 are rigid indexing fingers 76 which are individually translatable through the housing member 70. The upper ends of indexing fingers 76 are adapted to fit within indexing slots in circuit board 60.

In the use of the extension connector 62 to electrically connect the spaced circuit board 60 and connector plug 61 which are similarly indexed, the bottom ends of conductors 72 of extension connector 62 are inserted into the U-shaped connectors 67 of connector plug 61. The indexing fingers 76 then are pushed down into the spaces between the contacts 67 in connector plug 61 so that their upper ends are down within housing member 70. Because of the presence of blocking means 69, however, indexing means 76*a* cannot be inserted into the space between contacts in connector plug 61 and its upper end will extend above top surface of housing member 70. The contacts 63 on circuit board 60 now are brought into contact with the contacts 74 on the top ends of conductors 72. The upwardly extending top end of indexing finger 76*a* fits within the slot 64 in circuit board 60 and will not interfere with connection of contacts 63 of circuit board 60 to the contacts 74 of conductors 72. It is obvious that if circuit board 60 and connector plug 61 were not similarly indexed, the circuit board could not be brought into contact with contacts 74 of conductors 72 because one or more indexing fingers 76 would be extending above the end of housing member 70 at positions where there was no registering slot in the outwardly extending edge 65 of circuit board 60. This would prevent any connections being established between the contacts 63 and 74.

FIG. 5 illustrates another embodiment of this invention that is adapted to establish electrical connections between spaced indexed connector plugs, all of whose contacts are available for use. Connector plug 80 is of a conventional type which has a plurality of recessed cup-shaped contacts 81 that are adapted to receive therein pin-type contacts. Affixed to one face of connector plug 80 is an indexing plate 83 having indexing slots 84, 85 and 86 therein. The top connector plug 88 also is of a conventional type having the pin-type contacts 89 extending downwardly from its bottom surface. Affixed to one side of connector plug 88 is an indexing plate 90 which has the indexing fingers 91, 92 and 93 extending downwardly beyond the lower edge of the pin contacts 89. The indexing fingers 91, 92 and 93 are positioned and shaped to register with the indexing slots 84, 85 and 86 in the lower connector plug 80, and as will be seen, serve a purpose similar to the blocking means previously described.

The extension connector 100 is comprised of a body portion 101 which again may be made of a high impact plastic material, and fixedly disposed within the body portion 101 is a plurality of longitudinally extending conductors which are arranged in a pattern corresponding to the patterns of the connectors in the two connector plugs 80 and 88. The top ends of the conductors within the extension connector 100 are provided with recessed cup-shaped connectors 104 which are adapted to receive the pin contacts 89 of connector plug 88. The lower ends of the conductors of extension connector 100 are provided with connector pins 105 which extend below the lower bounding surface of the extension connector and are shaped to fit within the recessed contacts 81 in lower connector plug 80. Positioned on a broad wall of body portion 101 are a plurality of individually translatable indexing fingers 107 which are held in position by means of a cover 108 which has an aperture 109 therein. Each of the indexing fingers 107 has secured thereto an outwardly extending pin 111 which is positioned within the aperture 109.

In the use of the extension connector 100, all of the indexing fingers 107 would be moved to their uppermost positions in which their respective pins 111 rest against the upper edge of aperture 109. The pins 105 of extension connector 100 then are inserted into their corresponding recessed contacts 81 in bottom connector plug 80, and the indexing fingers 107*a*, 107*b*, 107*c* and 107*d* are moved down into the respective slots 84, 85 and 86 in the indexing plate 83. The connector pins 89 of top connector plate 88 then are inserted into the cup-shaped contacts 104 of the conductors in extension connector 100 and the indexing fingers 91, 92 and 93 fit within the void spaces that are established by the downwardly disposed indexing fingers 107*a*, 107*b*, 107*c* and 107*d*. It will be obvious that electrical connections cannot be established between the pins 89 of top connector plug 88 and the cup-shaped contacts 104 of the extension connector 100 unless the indexing fingers 91, 92 and 93 are indexed to correspond to the indexing of the lower connector plug 80 since there must be registering void spaces formed by the upper ends of indexing fingers 107 in order that the top connector plug 88 can be pushed downwardly to bring its contact pins 88 into engagement with the contacts 104 of the extension connector.

In all of the above-described embodiments of extension connectors only one extension connector would be required in a typical testing operation, in which many differently indexed circuit boards or plugs would be present, it being assumed that connections are to be established between the same types of connector plugs and/or circuit boards. This results from the fact that the translatable indexing means, whether they be the conductors themselves or means other than the conductors, are completely free to assume any indexing pattern within given indexing means.

We claim:

1. A universal extension connector for establishing connection between desired pairs of contacts of spaced groups of contacts, said groups of contacts having associated therewith distinctive complementary shaped indexing means that are aligned substantially parallel to the direction of movement that establishes connection between desired pairs of contacts of said groups of contacts, said connector comprising,
   - a housing member,
   - a first group of contacts at one end of said housing member adapted to engage the contacts of one of said spaced groups,
   - a second group of contacts at the opposite end of said housing member adapted to engage the contacts of the other of said spaced groups,
   - a plurality of index transfer members disposed in spaced parallel relation with respect to each other and supported by said housing means for translation longitudinally thereof,
   - one or more of said index transfer members being adapted to conform at opposite ends thereof to the respective shapes of the indexing means associated with the respective groups of spaced contacts.

2. The combination claimed in claim 1 wherein,
   - said index transfer members constitute elongated axially non-compressible conductors for providing electrical connections between said first and second groups of contacts at the opposite ends of said housing member.

3. The combination claimed in claim 1 wherein,
   - said index transfer members are separate from conductors that extend between said first and second groups of contacts at the opposite ends of said housing member.

4. Means for providing correct electrical connections only between correspondingly indexed first and second longitudinally spaced multi-contact connectors comprising,
   - first and second multi-contact connectors each having a plurality of electrical contacts disposed in spaced relationship,
   - said two connectors being longitudinally spaced from each other and having their respective electrical contacts in longitudinal alignment,
   - an extension connector disposed between said two connectors and comprised of a housing member that supports in electrical isolation from each other a plurality of elongated conductors that are disposed in spaced relationship,
   - respective conductors of said extension connector being in longitudinal alignment with aligned electrical contacts of said two connectors, thereby to provide respective electrical connections between said two connectors,
   - a plurality of elongated axially non-compressible indexing means disposed in spaced parallel relation with respect to each other and supported by said housing means for translation longitudinally thereof,
   - at least one recessed region on said first connector positioned in longitudinal alignment with a given one of said translatable indexing means,
   - blocking means on said second connector at a position in longitudinal alignment with the recessed region on the first connector for maintaining a given translatable indexing means in said recessed region when the electrical contacts of said first and second connectors are respectively in engagement with the ends of aligned conductors of said extension connector.

5. The combination claimed in claim 4 wherein
   - said plurality of translatable indexing means are the plurality of elongated conductors in said extension connector.

6. The combination claimed in claim 4 wherein
   - said plurality of translatable indexing means are means separate from said elongated conductors of the extension connector.

7. The combination claimed in claim 4 wherein
said recessed region is disposed intermediate adjacent electrical contacts on said first connector,
said blocking means being disposed intermediate adjacent electrical contacts on said second connector,
said plurality of translatable indexing means being arranged alternately with said plurality of elongated conductors whereby a translatable indexing means is disposed intermediate adjacent elongated conductors which are fixed relative to said housing member.

8. An extension connector for use in assuring the establishment of correct electrical connections between designated pairs of contacts from respective pluralities of spaced contacts, said extension connector comprising,
a plurality of longitudinally-extending conductors that are non-compressible in their longitudinal dimensions,
each of said conductors having a connector means on each end,
housing means supporting said conductors in spaced parallel relationship but permitting individual conductors to translate longitudinally therein,
said housing means providing access to both ends of said conductors whereby electrical connection may be made to the connector means of desired ones of said conductors.

9. The combination claimed in claim 8 wherein said housing means maintains said conductors in electrical isolation from each other.

10. The combination claimed in claim 8 wherein said housing means is longitudinally shorter than said conductors whereby at least one of said connector means on each conductor may extend beyond a bounding surface of said housing means.

11. Means for providing correct electrical connections only between designated first and second longitudinally spaced multiple-contact members comprising,
a first multiple-contact member having a plurality of electrical contacts disposed in spaced relationship,
said electrical contacts being arranged in an indexed pattern characterized by at least one void space that eliminates an electrical contact from what otherwise would be a given pattern of contacts,
a second multiple-contact member having a plurality of electrical contacts that are longitudinally aligned with respective contacts of said first member,
an extension connector disposed between said two multiple-contact members and comprised of a housing member that supports in electrical isolation from each other a plurality of elongated axially non-compressible conductors that are disposed in spaced parallel relationship,
said elongated conductors being arranged in a pattern corresponding to said given pattern and being individually longitudinally translatable through said housing member,
blocking means disposed on said second multiple-contact member at a position in longitudinal alignment with the void space in the first multiple-contact member for maintaining a registering elongated conductor in said void space when the electrical contacts of said contact member are in electrical engagement with aligned elongated conductors.

12. The combination claimed in claim 11 wherein
said second multiple-contact member is comprised of a plurality of recessed electrical contacts each of which is adapted to receive therein an end of an aligned elongated conductor,
said blocking means being disposed to block its corresponding recessed contact to prevent an elongated conductor from entering therein.

13. The combination claimed in claim 11 wherein,
said first multiple-contact member is comprised of an edge region of a thin supporting member upon which electrical circuit components are disposed,
said electrical contacts of the first multiple-contact member being arranged in spaced parallel relationship on said edge region, and
said void space being a slot that extends inwardly through said edge region.

14. The combination claimed in claim 11 wherein,
said electrical contacts of said first multiple-contact member are comprised of connector pins that extend outwardly from a body portion of a connector plug,
said void space being provided by the absence of a pin from the connector plug.

15. Means for providing correct electrical extension connections only between correspondingly indexed first and second longitudinally spaced multi-contact connectors wherein one of said connectors has disposed thereon in a region removed from its contacts at least one recessed region and wherein the other of said connectors has disposed thereon in a region removed from its contacts at least one blocking means, said first-named means comprising,
an extension connector disposed between said two connectors and comprised of a housing member that fixedly supports in electrical isolation from each other a plurality of longitudinally extending conductors that are positioned to engage the respective contacts of said two connectors,
a plurality of parallel disposed longitudinally translatable indexing means in said housing member,
at least one of said longitudinally translatable indexing means being positioned to be aligned with the recessed region and the blocking means of the respective connectors, whereby said blocking means translates said one translatable indexing means into said recessed region when the contacts of said two connectors are in electrical engagement with the conductors of said extension connector.

16. The combination claimed in claim 15 wherein,
individual ones of said translatable indexing means are disposed alternately with said longitudinally extending conductors within said housing means.

17. The combination claimed in claim 15 wherein,
said plurality of translatable indexing means are adjacently positioned in overlaying relationship to said plurality of longitudinally extending conductors.

References Cited

UNITED STATES PATENTS

| | | | |
|---|---|---|---|
| 2,765,450 | 10/1956 | Richardson | 339—192 |
| 2,935,725 | 5/1960 | Fox | 339—184 |
| 2,946,033 | 7/1960 | Wirth | 339—17 |
| 3,112,974 | 12/1963 | Curtis et al. | 339—186 X |
| 3,264,599 | 8/1966 | Kinkaid | 339—184 X |

MARVIN A. CHAMPION, *Primary Examiner.*

G. R. MOSES, *Assistant Examiner.*

UNITED STATES PATENT OFFICE
CERTIFICATE OF CORRECTION

Patent No. 3,364,458 January 16, 1968

Charles J. Black, Jr., et al.

It is hereby certified that error appears in the above numbered patent requiring correction and that the said Letters Patent should read as corrected below.

In the heading to the printed specification, lines 6 to 8, for "assignors to Kernforschungsanlage Julich des Landes Nordrhein-Westfalen-e.V., Julich, Germany, a corporation of Germany" read -- assignors to Cutler-Hammer, Inc., Milwaukee, Wis., a corporation of Delaware --.

Signed and sealed this 11th day of March 1969.

(SEAL)
Attest:

Edward M. Fletcher, Jr.
Attesting Officer

EDWARD J. BRENNER
Commissioner of Patents